US011972537B2

United States Patent
Chen et al.

(10) Patent No.: US 11,972,537 B2
(45) Date of Patent: Apr. 30, 2024

(54) METHOD, SYSTEM, AND NON-TRANSITORY COMPUTER-READABLE MEDIUM FOR FLATTENING THREE-DIMENSIONAL SHOE UPPER TEMPLATE

(71) Applicant: YU JUNG CHANG TECHNOLOGY CO., LTD., New Taipei (TW)

(72) Inventors: Chih-Chuan Chen, New Taipei (TW);
Wei-Hsiang Tsai, New Taipei (TW);
Chin-Yu Chen, New Taipei (TW);
Ching-Cherng Sun, New Taipei (TW);
Jann-Long Chern, New Taipei (TW);
Yu-Kai Lin, New Taipei (TW)

(73) Assignee: YU JUNG CHANG TECHNOLOGY CO., LTD., New Taipei (TW)

( * ) Notice: Subject to any disclaimer, the term of this patent is extended or adjusted under 35 U.S.C. 154(b) by 34 days.

(21) Appl. No.: 17/891,460

(22) Filed: Aug. 19, 2022

(65) Prior Publication Data
US 2023/0057550 A1 Feb. 23, 2023

(30) Foreign Application Priority Data
Aug. 19, 2021 (TW) .................................. 110130769

(51) Int. Cl.
*G06T 17/20* (2006.01)
*A41H 3/00* (2006.01)
*A43D 8/26* (2006.01)
*G06T 3/00* (2006.01)

(52) U.S. Cl.
CPC ........... *G06T 3/0031* (2013.01); *A41H 3/007* (2013.01); *A43D 8/26* (2013.01); *G06T 17/20* (2013.01); *A43D 2200/60* (2013.01)

(58) Field of Classification Search
None
See application file for complete search history.

(56) References Cited

U.S. PATENT DOCUMENTS

| | | | | |
|---|---|---|---|---|
| 2017/0109926 A1* | 4/2017 | Bonner | ................... | G06T 17/20 |
| 2020/0004893 A1* | 1/2020 | Bernardon | .............. | G06T 17/00 |
| 2020/0253331 A1* | 8/2020 | Davis | ................... | A43C 11/002 |
| 2021/0097737 A1* | 4/2021 | Kim | ...................... | G06T 11/006 |

* cited by examiner

*Primary Examiner* — Joni Hsu
(74) *Attorney, Agent, or Firm* — MUNCY, GEISSLER, OLDS & LOWE, PC

(57) ABSTRACT

A method for flattening a three-dimensional shoe upper template is provided. The method includes providing a three-dimensional last model, obtaining a three-dimensional grid model, obtaining a three-dimensional thickened grid model, obtaining a two-dimensional initial-value grid model, and obtaining a two-dimensional grid model with the smallest energy value. A system and a non-transitory computer-readable medium for performing the method are also provided. The method makes it possible to precisely flatten a three-dimensional last model with a non-developable surface and thereby convert the three-dimensional last model into a two-dimensional grid model.

18 Claims, 8 Drawing Sheets

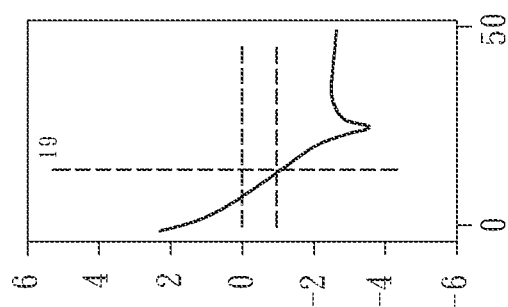
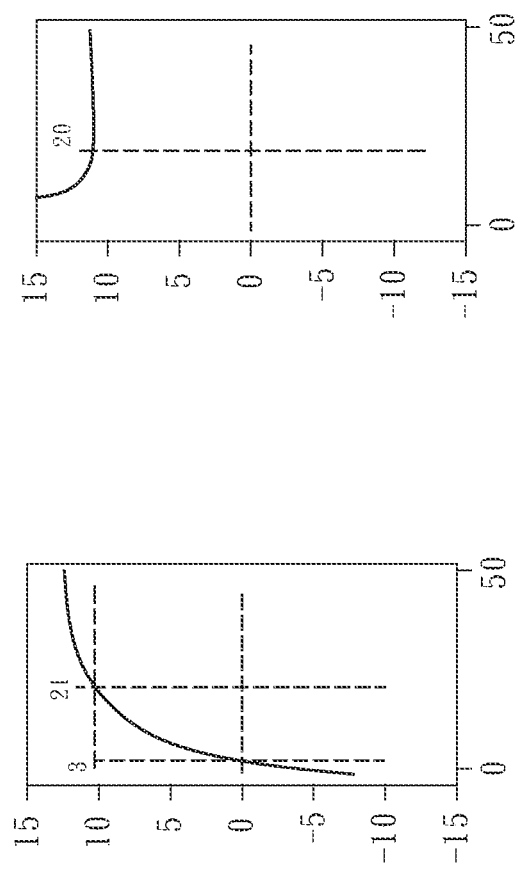
FIG. 4A  FIG. 4B  FIG. 4C

METHOD, SYSTEM, AND NON-TRANSITORY COMPUTER-READABLE MEDIUM FOR FLATTENING THREE-DIMENSIONAL SHOE UPPER TEMPLATE

BACKGROUND OF THE INVENTION

1. Technical Field

The present invention relates to a method for converting a three-dimensional template into a two-dimensional one. More particularly, the invention relates to a method, system, and non-transitory computer-readable medium for flattening a three-dimensional shoe upper template.

2. Description of Related Art

To make a shoe prototype in a conventional manner, a skilled shoe artisan would begin by drawing the design of the shoe based on his or her experience and then make a tangible three-dimensional prototype according to the design. More specifically, the artisan would generally be provided with pre-made shoe lasts of different sizes, make one or more two-dimensional templates for, and according to, each last, render the one or more two-dimensional templates for each last into a three-dimensional template, and repeat the foregoing steps until the three-dimensional template for each last is as similar to the last as possible. The one or more two-dimensional templates corresponding to the most similar three-dimensional template for each last can be regarded as having the highest operability.

With the development of algorithms, it has been possible to obtain an intangible three-dimensional last model directly by scanning a tangible last and convert the three-dimensional model into a two-dimensional model by way of at least one algorithm. The shoe industry, however, is currently faced with the following difficulty: While a tangible last can be obtained in advance and scanned to produce an intangible three-dimensional model, and the three-dimensional model can be rendered into various two-dimensional models through existing algorithms, a three-dimensional shoe prototype made according to such a two-dimensional model rarely bears a close resemblance to the three-dimensional model, let alone the real last. Therefore, it has been at the core of the competitive advantage in the shoe industry to be able to obtain a two-dimensional last model with a low degree of distortion, i.e., a two-dimensional model that allows a three-dimensional shoe prototype made according thereto to be faithful to the three-dimensional last model from which the two-dimensional model is derived.

BRIEF SUMMARY OF THE INVENTION

One objective of the present invention is to provide a method for flattening a three-dimensional shoe upper template, or more particularly for flattening a three-dimensional last model having a non-developable surface, thereby converting the three-dimensional last model into a two-dimensional grid model with a low degree of distortion.

Another objective of the present invention is to provide a method for flattening a three-dimensional shoe upper template and thereby producing a low-distortion two-dimensional grid model in a rapid and efficient manner.

To achieve the foregoing objectives, the present invention provides a method for flattening a three-dimensional shoe upper template, and the method includes the following steps: providing a three-dimensional last model, wherein the three-dimensional last model includes a three-dimensional borderline, and the three-dimensional borderline includes a three-dimensional inner feather line and a three-dimensional outer feather line; performing a topological operation on the three-dimensional last model by a processing unit to obtain a three-dimensional grid model corresponding to the three-dimensional last model, wherein the three-dimensional grid model includes a plurality of three-dimensional border grids and a plurality of three-dimensional inner grids, and each three-dimensional border grid has a portion located on the three-dimensional borderline; performing a thickening operation on the three-dimensional grid model by the processing unit to obtain a three-dimensional thickened grid model; performing a dimensionality reduction operation on the three-dimensional thickened grid model by the processing unit to obtain a two-dimensional initial-value grid model; and obtaining a two-dimensional grid model with the smallest energy value. The step of obtaining a two-dimensional grid model with the smallest energy value at least includes the following three steps: performing an iterative operation for finding a least-squares solution on the two-dimensional initial-value grid model by the processing unit to obtain a two-dimensional corrected grid model from each execution of the iterative operation, wherein each two-dimensional corrected grid model includes a plurality of two-dimensional corrected border grids corresponding to the three-dimensional border grids and a plurality of two-dimensional corrected inner grids corresponding to the three-dimensional inner grids, the two-dimensional corrected border grids of each two-dimensional corrected grid model jointly define a two-dimensional corrected borderline, each two-dimensional corrected borderline includes a two-dimensional corrected inner feather line and a two-dimensional corrected outer feather lure, and there is a length difference between each two-dimensional corrected inner feather line and the three-dimensional inner feather line or between each two-dimensional corrected outer feather line and the three-dimensional outer feather line; performing an energy operation on each dimensional corrected grid model by the processing unit to calculate the sum of energy of the two-dimensional corrected border grids of each two-dimensional corrected grid model; and obtaining, from the plurality of two-dimensional corrected grid models produced by the iterative operation, a two-dimensional grid model with a length difference falling within a predetermined range and with two-dimensional corrected border grids having the smallest sum of energy.

Through the foregoing steps, a three-dimensional last model having a non-developable surface can be flattened with precision and thereby converted into a two-dimensional grid model.

In the method disclosed in one embodiment of the present invention for flattening a three-dimensional shoe upper template, the thickening operation includes: selecting a normal vector of each three-dimensional border grid; and adding a predetermined thickness according to the selected normal vectors to form the three-dimensional thickened grid model.

In the method disclosed in one embodiment of the present invention for flattening a three-dimensional shoe upper template, the predetermined thickness is 0-1 mm.

In the method disclosed in one embodiment of the present invention for flattening a three-dimensional shoe upper template, the sum of energy corresponding to an execution of the iterative operation is determined to be the smallest if the $\log_{10}$ to of the absolute value of the difference between the sum of energy corresponding to that execution of the iterative operation and the sum of energy corresponding to the previous execution of the iterative operation is less than −1.

In the method disclosed in one embodiment of the present invention for flattening a three-dimensional shoe upper template, the predetermined range for the length differences is 0-10 mm.

In the method disclosed in one embodiment of the present invention for flattening a three-dimensional shoe upper template, the iterative operation is executed 1-50 times.

To achieve the foregoing objectives, the present invention further provides a system for flattening a three-dimensional shoe upper template, and the system includes a memory, a processing unit, and a user interface. The memory is configured to store one or more computer programs that include a plurality of instructions. The processing unit is configured to execute the instructions to carry out the steps of the aforesaid method for flattening a three-dimensional shoe upper template. The user interface is generated by the processing unit.

In the system disclosed in one embodiment of the present invention for flattening a three-dimensional shoe upper template, the thickening operation includes: selecting a normal vector of each three-dimensional border grid; and adding a predetermined thickness according to the selected normal vectors to form the three-dimensional thickened grid model.

In the system disclosed in one embodiment of the present invention for flattening a three-dimensional shoe upper template, the predetermined thickness is 0-1 mm.

In the system disclosed in one embodiment of the present invention for flattening a three-dimensional shoe upper template, the sum of energy corresponding to an execution of the iterative operation is determined to be the smallest if the $\log_{10}$ of the absolute value of the difference between the sum of energy corresponding to that execution of the iterative operation and the sum of energy corresponding to the previous execution of the iterative operation is less than −1.

In the system disclosed in one embodiment of the present invention for flattening a three-dimensional shoe upper template, the predetermined range for the length differences is 0-10 mm.

In the system disclosed in one embodiment of the present invention for flattening a three-dimensional shoe upper template, the iterative operation is executed. 1-50 times.

To achieve the foregoing objectives, the present invention further provides a non-transitory computer-readable medium for storing one or more computer programs that include a plurality of instructions to be executed by a processing unit. When executed by the processing unit, the instructions cause the processing unit to carry out the steps of the aforesaid method for flattening a three-dimensional shoe upper template.

In the non-transitory computer-readable medium disclosed in one embodiment of the present invention, the thickening operation includes: selecting a normal vector of each three-dimensional border grid, and adding a predetermined thickness according to the selected normal vectors to form the three-dimensional thickened grid model.

In the non-transitory computer-readable medium disclosed in one embodiment of the present invention, the predetermined thickness is 0-1 mm.

In the non-transitory computer-readable medium disclosed in one embodiment of the present invention, the sum of energy corresponding to an execution of the iterative operation is determined to be the smallest if the $\log_{10}$ of the absolute value of the difference between the sum of energy corresponding to that execution of the iterative operation and the sum of energy corresponding to the previous execution of the iterative operation is less than −1.

In the non-transitory computer-readable medium disclosed in one embodiment of the present invention, the predetermined range for the length differences is 0-10 mm.

In the non-transitory computer-readable medium disclosed in one embodiment of the present invention, the iterative operation is executed 1-50 times.

BRIEF DESCRIPTION OF THE SEVERAL VIEWS OF THE DRAWINGS

FIG. 4A is a plot showing the relationship between the length difference between a two-dimensional corrected outer feather line and the three-dimensional outer leather line of the three-dimensional last model and the number of times for which an iterative operation has been executed, FIG. 4B is a plot showing the relationship between the sum of energy of a corrected lateral and the number of times for which the iterative operation has been executed, and FIG. 4C is a plot showing the relationship between the difference in the sum of energy of a corrected lateral between each two consecutive executions of the iterative operation and the number of times for which the iterative operation has been executed.

DETAILED DESCRIPTION OF THE INVENTION

Figure 1:
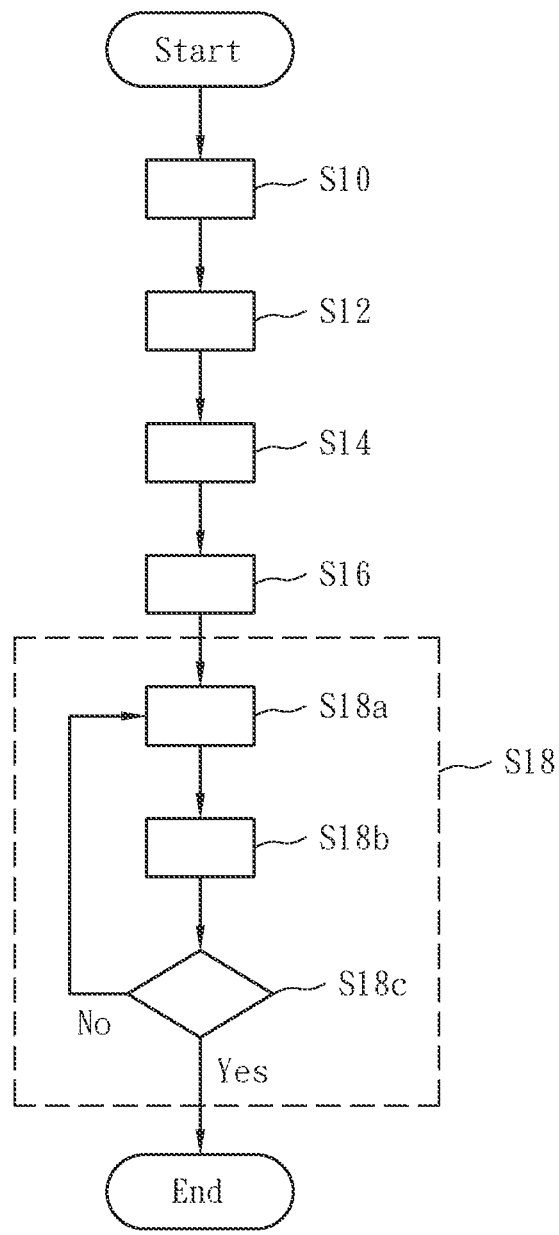
FIG. 1 is the flowchart of the method of the present invention for flattening a three-dimensional shoe upper template.

Some embodiments of the method of the present invention for flattening a three-dimensional shoe upper template are described below with reference to the accompanying drawings, in which the same elements are indicated by the same reference numeral.

Please refer to FIG. 1 for the flowchart of the method of the present invention for flattening a three-dimensional shoe upper template, and FIG. 2A to FIG. 2D for drawings corresponding to the steps in FIG. 1.

Figure 2A:
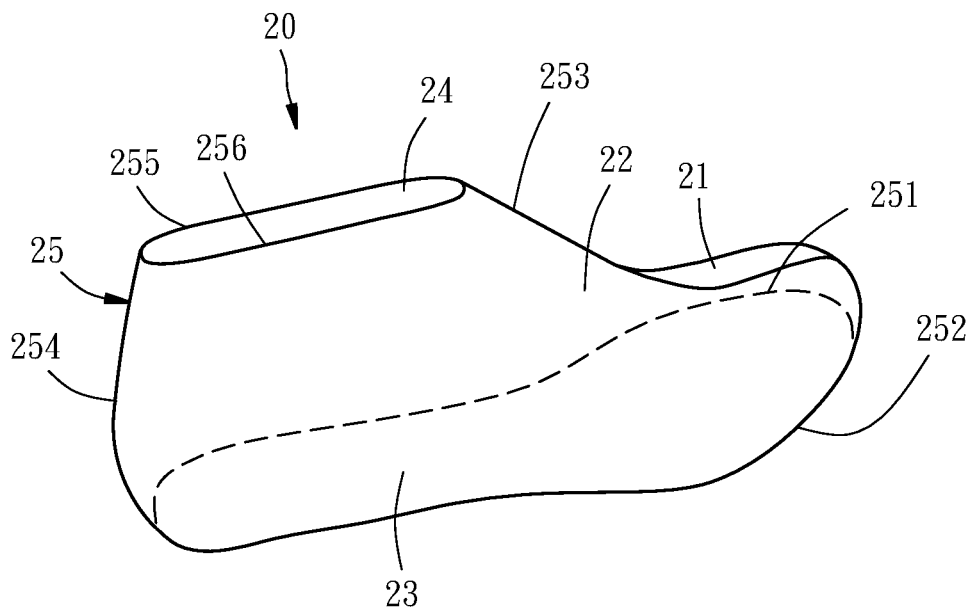
FIG. 2A to FIG. 2D respectively show a three-dimensional last model, a three-dimensional grid model, a three-dimensional thickened grid model, and a two-dimensional initial-value grid model of the invention.

According to the embodiment shown in FIG. 1, the method of the present invention for flattening a three-dimensional shoe upper template at least includes the following steps: providing a three-dimensional last model (step S10); obtaining a three-dimensional grid model (step S12); obtaining a three-dimensional thickened grid model (step S14); obtaining a two-dimensional initial-value grid model (step S16); and obtaining a two-dimensional grid model with the smallest energy value (step S18). The steps are detailed as follows:

Step S10 of providing a three-dimensional last model: As the first step, a three-dimensional last model 20 is provided as shown in FIG. 2A. The three-dimensional last model 20 is composed of four surfaces, namely a medial 21, a lateral 22, an insole 23, and an opening surface 24. The three-dimensional last model 20 further includes a three-dimensional borderline 25. The three-dimensional borderline 25 includes a three-dimensional inner feather line 251, a three-dimensional outer feather line 252, a three-dimensional instep centerline 253, a three-dimensional heel centerline 254, a three-dimensional inner opening line 255, and a three-dimensional outer opening line 256. It is the three-dimensional borderline 25 that divides the three-dimensional last model 20 into the medial 21, the lateral 22, and the insole 23. More specifically, the three-dimensional inner feather line 251, the three-dimensional instep centerline 253, the three-dimensional heel centerline 254, and the three-dimensional inner opening line 255 jointly constitute the border of the medial 21; the three-dimensional outer feather line 252, the three-dimensional instep centerline 253, the three-dimensional heel centerline 254, and the three-dimensional outer opening line 256 jointly constitute the border of the lateral 22; and the three-dimensional inner feather line 251 and the three-dimensional outer feather line 252 jointly constitute the border of the insole 23. This three-dimensional last model may be constructed from a shoe prototype or from the shape of a foot by, for example but not limited to, a direct model construction technique. The reason why a traditional manual shoemaking process cannot provide rapid customization lies in the making of lasts and templates. A last takes a lot of time to make. If an error is made during the last making process, and correction is impossible, the last must be remade, By contrast, a three-dimensional last model constructed with the assistance of a computer not only can be saved as a data file, but also can be fine-tuned and go through subsequent procedures (e.g., planarization), thus simplifying the front-end process flow, and enhancing the production efficiency, of the shoe industry.

Figure 2B:
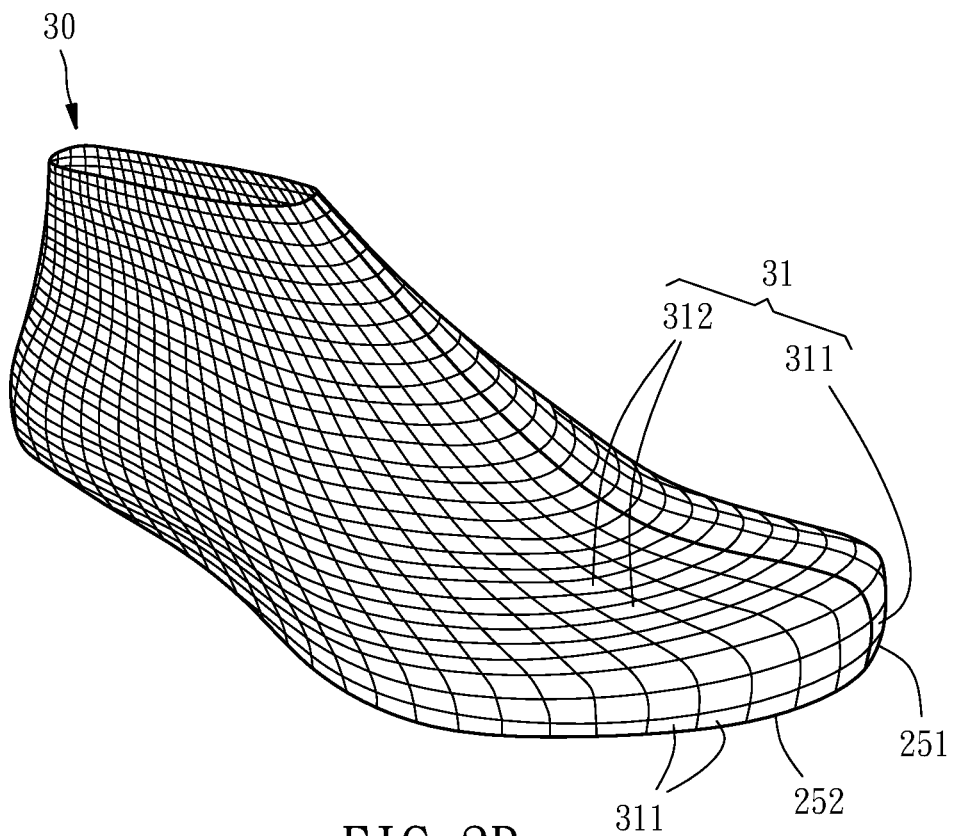

Step S12 of obtaining a three-dimensional grid model: A processing unit performs a topological operation on the three-dimensional last model 20 to obtain a three-dimensional grid model 30 corresponding to the three-dimensional last model 20, as shown in FIG. 2B. The three-dimensional grid model 30 includes a plurality of three-dimensional grids 31 defined therefor. The three-dimensional grids 31 include three-dimensional border grids 311 and three-dimensional inner grids 312. The three-dimensional inner grids 312 are defined as those three-dimensional grids 31 that are not the three-dimensional border grids 311. Each three-dimensional border grid 311 has a portion located on the three-dimensional borderline 25 of the three-dimensional last model 20. Here, the topological operation may, be, but is not limited to, a Delaunay triangulation algorithm, a Voronoi diagram algorithm, or a surface fitting algorithm.

Figure 2C:
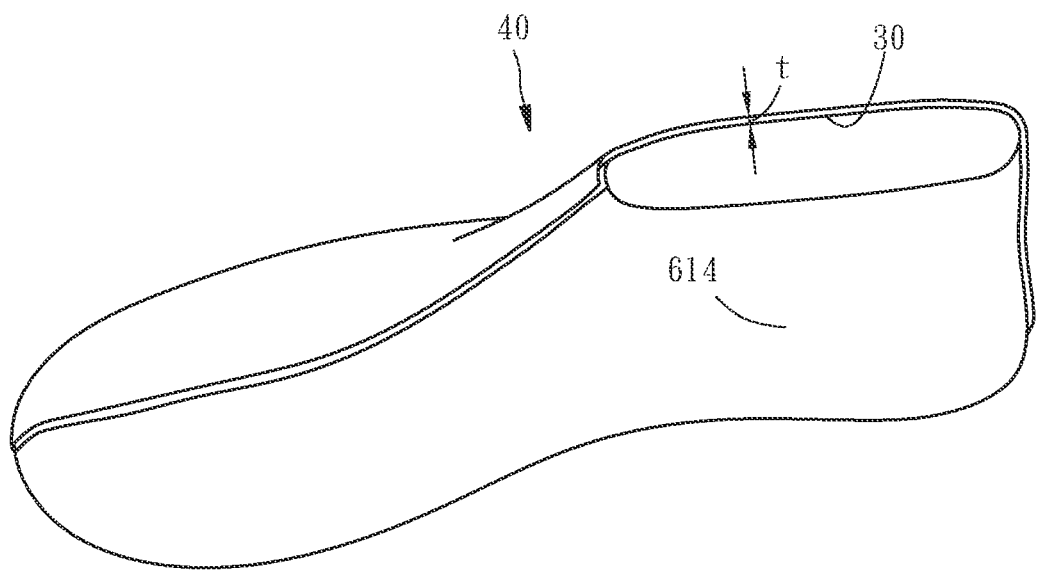

Step S14 of obtaining a three-dimensional thickened grid model: The processing unit performs a thickening operation on the three-dimensional grid model 30 to obtain a three-dimensional thickened grid model 40, as shown in FIG. 2C. The three-dimensional thickened grid model 40 in FIG. 2C is formed on the basis of the three-dimensional grid model 30, or more particularly is formed by adding a predetermined thickness t along, and in the outward direction of, a selected normal vector of each three-dimensional grid 31 (i.e., of each three-dimensional border grid 311 and three-dimensional inner grid 312). The selected normal vector of each three-dimensional grid 31 may be, but is not limited to, a normal line extending from the geometric center of the three-dimensional grid 31. The predetermined thickness t may be 0-1 mm. In view of the fact that a joining edge must be reserved along the border of each of a plurality of two-dimensional shoe templates that are to be stitched together to reconstruct the corresponding three-dimensional shoe design, the three-dimensional thickened grid model 40, which has been thickened in step S14, may have spaces reserved for making those joining edges.

Figure 2D:
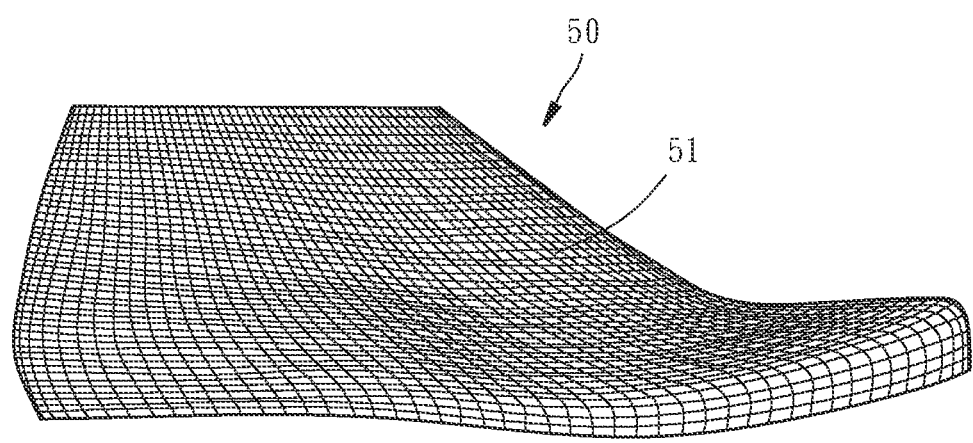

Step S16 of obtaining a two-dimensional initial-value grid model: The processing unit performs a dimensionality reduction operation on the three-dimensional thickened grid model 40 to obtain a two-dimensional initial-value grid model 50 as shown in FIG. 2I). Here, the dimensionality reduction operation may use a projection method by which the three-dimensional thickened grid model 40 is projected directly onto a plane to obtain the two-dimensional initial-value grid model 50. The dimensionality reduction operation includes dividing the three-dimensional thickened grid model 40 into three portions, namely a medial portion, a lateral portion, and an insole portion, and is performed on the three portions separately. Therefore, the two-dimensional initial-value grid model 50 obtained from the dimensionality reduction operation includes a projected medial (not shown), a projected lateral 51, and a projected insole (not shown) that correspond to, and are flattened forms of, the medial 21, the lateral 22, and the insole 23 of the three-dimensional last model 20 respectively. FIG. 2D shows the projected lateral 51, which is derived from the three-dimensional thickened grid model 40 and corresponds to the lateral 22 of the three-dimensional last model 20. While only the lateral part of the two-dimensional initial-value grid model 50 is illustrated herein, the medial part and the insole part can be obtained in the same way. The dimensionality reduction operation may alternatively use, for example but not limited to, an angle-based flattening (ABF) algorithm or a least-squares conformal maps (LSCM) algorithm. The two-dimensional initial-value grid model 50 may be planar grids that are shape-preserving to a certain degree.

Figure 3A:
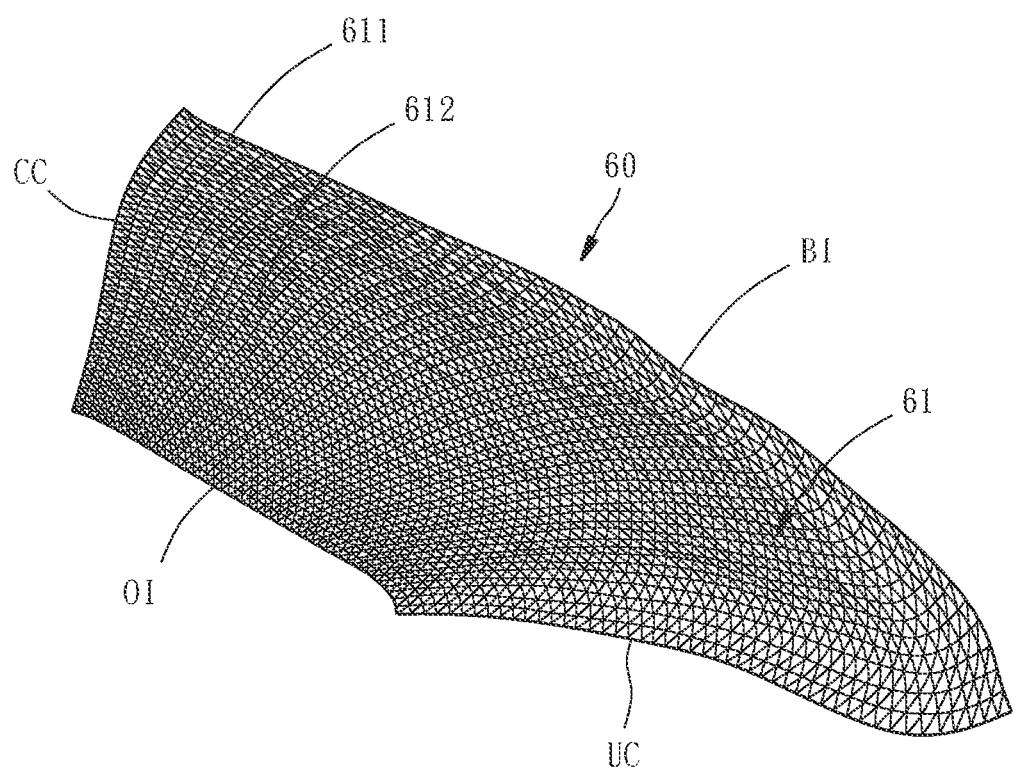
FIG. 3A to FIG. 3C respectively show a corrected medial, a corrected lateral, and a corrected insole corresponding to the three-dimensional last model.
Figure 3B:
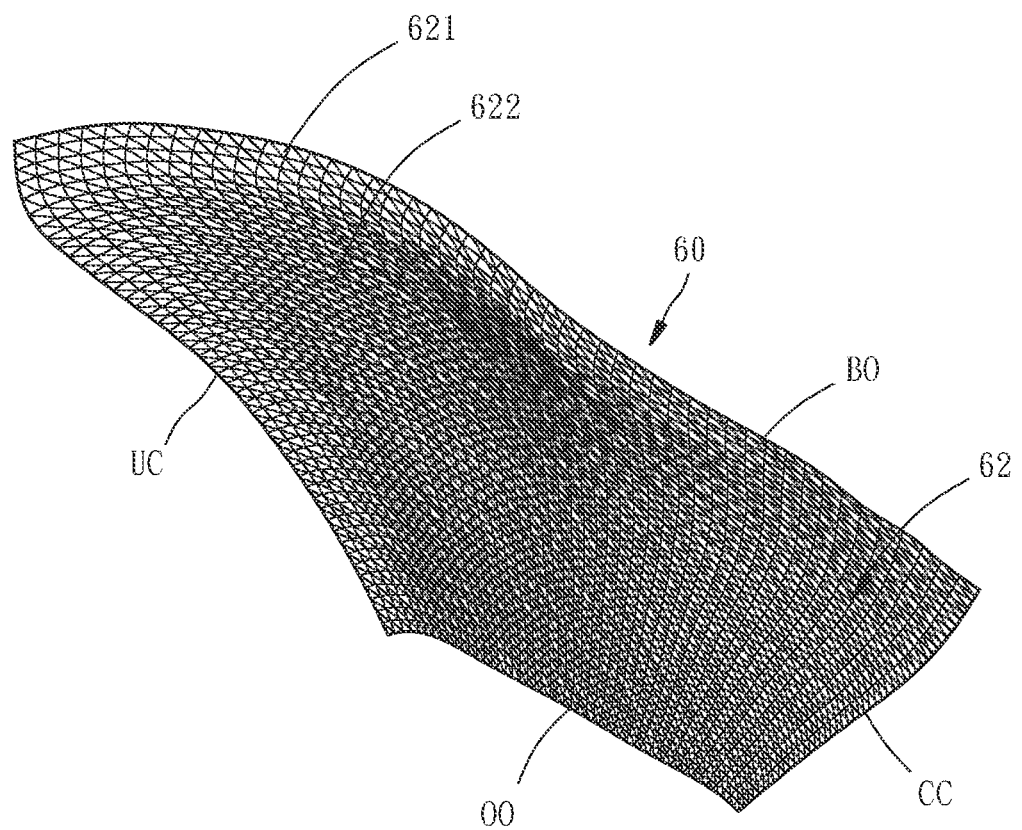
Figure 3C:
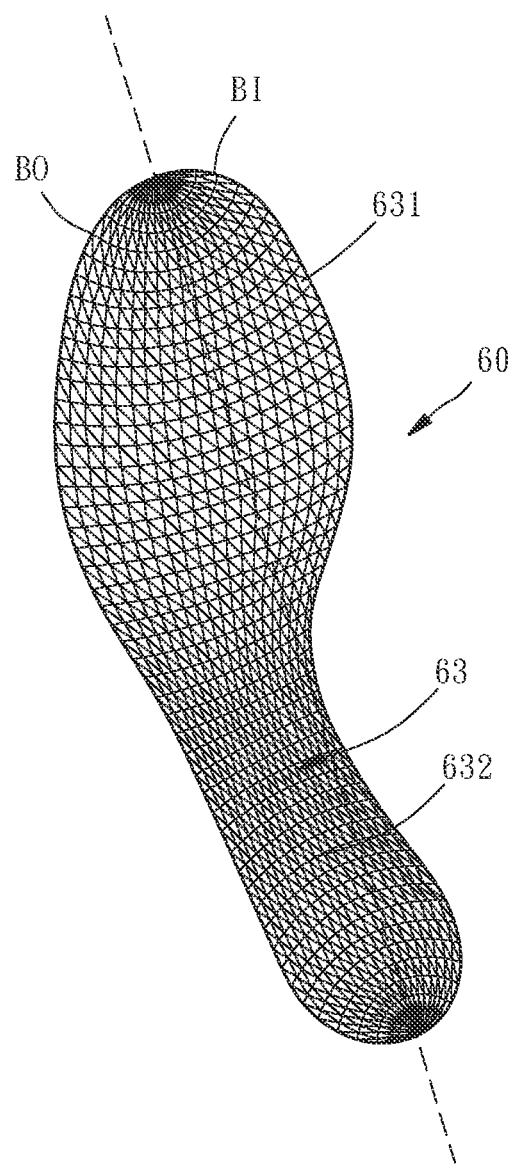

Step S18 of obtaining a two-dimensional grid model with the smallest energy value: Step S18 further includes the steps of: performing an iterative operation for finding a least-squares solution (step S18a); performing an energy operation (step S18b); and obtaining a final two-dimensional grid model (step S18c), as detailed below:

Step S18a: The processing unit performs on the two-dimensional initial-value grid model 50 an iterative operation for finding a least-squares solution, with each execution of the iterative operation producing a two-dimensional corrected grid model 60 corresponding to the operation being executed for finding a least-squares solution. The two-dimensional corrected grid model 60 obtained from each execution of the iterative operation, i.e., obtained each time the operation for finding a least-squares solution is performed on the two-dimensional initial-value grid model 50, includes a corrected medial 61 (as shown in FIG. 3A), a corrected lateral 62 (as shown in FIG. 3B), and a corrected insole 63 (as shown in FIG. 3C) that correspond to, and are flattened forms of, the medial 21, the lateral 22, and the insole 23 of the three-dimensional last model 20 respectively. Each two-dimensional corrected grid model 60 further includes a plurality of two-dimensional corrected border grids 611, 621, and 631 that correspond to the three-dimensional border grids 311 and a plurality of two-dimensional corrected inner grids 612, 622, and 632 that correspond to the three-dimensional inner grids 312. The two-dimensional corrected border grids 611, 621, and 631 of each two-dimensional corrected grid model 60 jointly define a two-dimensional corrected borderline BL that includes a two-dimensional corrected inner feather line BI corresponding to the three-dimensional inner feather line 251, a two-dimensional corrected outer feather line BO corresponding to the three-dimensional outer feather line 252, a two-dimensional corrected instep centerline UC corresponding to the three-dimensional instep centerline 253, a two-dimensional corrected heel centerline CC corresponding to the three-dimensional heel centerline 254, a two-dimensional corrected inner opening line OI corresponding to the three-dimensional inner opening line 255, and a two-dimensional corrected outer opening line OO corresponding to the three-dimensional outer opening line 256. There is a length difference between each two-dimensional corrected inner feather line BI and the three-dimensional inner feather line 251 or between each two-dimensional corrected outer feather line BO and the three-dimensional outer feather line 252.

Step S18b: The processing unit performs an energy operation on each two-dimensional corrected grid model 60 to calculate the sum of energy of the two-dimensional corrected border grids 611, 621, and 631 of each two-dimensional corrected grid model 60. As each execution of the operation for finding a least-squares solution produces a corresponding two-dimensional corrected grid model 60, step S18b performs the energy operation, i.e., energy summation operation, on the two-dimensional corrected border grids 611, 621, and 631 of each two-dimensional corrected grid model 60 newly produced in step S18a to obtain a corresponding sum of energy. For example, the sum of energy of a corrected medial 61 is the sum of the energy of the two-dimensional corrected border grids 611 that are located on the corresponding two-dimensional corrected inner feather line BI, the corresponding two-dimensional corrected instep centerline UC, the corresponding two-dimensional corrected heel centerline CC, and the corresponding two-dimensional corrected inner opening line OI; the sum of energy of a corrected lateral 62 is the sum of the energy of the two-dimensional corrected border grids 621 that are located on the corresponding two-dimensional corrected outer feather line BO, the corresponding two-dimensional corrected instep centerline UC, the corresponding two-dimensional corrected heel centerline CC, and the corresponding two-dimensional corrected outer opening line OO; and the sum of energy of a corrected insole 63 is the sum of the energy of the two-dimensional corrected border grids 631 that are located on the corresponding two-dimensional corrected inner leather line BI and the corresponding two-dimensional corrected outer feather line BO.

Step S18c: The processing unit performs a determination operation on the plurality of two-dimensional corrected grid models 60 produced by the iterative operation, to obtain from the plurality of two-dimensional corrected grid models 60 a two-dimensional grid model (not shown) whose length difference falls within a predetermined range and whose two-dimensional corrected border grids 611, 621, and 632 have the smallest sum of energy. The two-dimensional grid model obtained is the final two-dimensional grid model. As each two-dimensional corrected grid model 60 includes its own corrected medial 61, corrected lateral 62, and corrected insole 63, the aforesaid two conditions concerning the length difference and the smallest sum of energy should be applied in such a way that the final two-dimensional medial is obtained from the plurality of corrected medials 61 as the one whose length difference falls within the predetermined range and whose two-dimensional corrected border grids 611 have the smallest sum of energy, and that the final two-dimensional lateral and the final two-dimensional insole are obtained from the plurality of corrected laterals 62 and the plurality of corrected insoles 63 respectively in a similar manner. Thus, the final two-dimensional medial is a corrected medial 61 that satisfies the aforesaid two conditions, the final two-dimensional lateral is a corrected lateral 62 that satisfies the aforesaid two conditions, and the final two-dimensional insole is a corrected insole 63 that satisfies the aforesaid two conditions. The final two-dimensional grid model is formed by the final two-dimensional medial, the final two-dimensional lateral, and the final two-dimensional insole. Simply put, each time step S18b obtains a sum of energy, a screening operation will also be performed to determine whether the length difference defined in step S18a falls the predetermined range, the objective being to determine whether the two conditions (i.e., the length difference falling within the predetermined range and the sum of energy being the smallest) are simultaneously met. The predetermined range for the length differences may be 0-10 mm or further defined as follows: the length difference between a two-dimensional corrected outer feather line BO and the three-dimensional outer feather line 252 should range front 0 to 10 mm, and the length difference between a two-dimensional corrected inner feather line BI and the three-dimensional inner feather line 251 should range front 0 to 10 mm. It is worth noting that the iterative operation in step S18a and the energy operation in step S18b may be developed from, for example but not limited to, an ARAP (As-Rigid-As-Possible) surface parameterization algorithm. For more details about the ARAP surface parameterization algorithm, reference may be made to L. Liu, L. Zhang, Y. Xu, C. Gotsman, and S. J. Gortler, "A local/global approach to mesh parameterization" in Computer Graphics Forum, Wiley Online Library, vol. 27, 2008, pp. 1495-1504.

Please refer to FIG. 4A for a plot showing the relationship between the length difference between a two-dimensional corrected outer feather line BO and the three-dimensional outer feather line 252 of the three-dimensional last model 20 and the number of times for which the iterative operation has been executed, FIG. 4B for a plot showing the relationship between the sum of energy of a corrected lateral 62 and the number of times for which the iterative operation has been executed, and FIG. 4C for a plot showing the relationship between the difference in the sum of energy of a corrected lateral 62 between each two consecutive executions of the iterative operation and the number of times for which the iterative operation has been executed. In FIG. 4A, the horizontal axis (X axis) represents the number of times (from 0 to 50) for which the iterative operation has been executed, and the vertical axis (Y axis) represents the length difference (in mm) between a two-dimensional corrected outer feather line BO and the three-dimensional outer feather line 252 of the three-dimensional last model 20. According to the operation results in FIG. 4A, the length difference ranges from 0 to 10 mm between the $3^{rd}$ and the $21^{st}$ executions of the iterative operation. In FIG. 4B, the horizontal axis (X axis) represents the number of times (from 0 to 50) for which the iterative operation has been executed, and the vertical axis (Y axis) represents the sum of the energy of the two-dimensional corrected border grids 621 of a corrected lateral 62. More specifically, the sum of energy of the corrected lateral 62 as plotted in FIG. 4B is the sum of the energy of the two-dimensional corrected border grids 621 located on the corresponding two-dimensional corrected outer feather line BO, two-dimensional corrected instep centerline UC, two-dimensional corrected heel centerline CC, and two-dimensional corrected outer opening line OO. According to the operation results in FIG. 4B, the smallest sum of energy occurs at the $20^{th}$ execution of the iterative operation. FIG. 4C discloses another way to obtain the smallest sum of energy, with the horizontal axis (X axis) representing the number of times (from 0 to 50) for which the iterative operation has been executed, and the vertical axis (Y axis) representing the logic of the absolute value of the difference between the sum of energy corresponding to an execution of the iterative operation and the sum of energy corresponding to the previous execution of the iterative operation. According to the operation results in FIG. 4C, the $19^{th}$ execution of the iterative operation brings the vertical-axis value to −1, indicating that the energy difference is 0.1. To sum up the operation results in FIG. 4A and FIG. 4B, the length difference falls within the range of 0-10 mm between the $3^{rd}$ and the $21^{st}$ executions of the iterative operation, and the sum of enemy is the smallest when the iterative operation is executed 20 times; therefore, the result of the $20^{th}$ execution of the iterative operation is the optimal, i.e., the result from which the final two-dimensional grid model can be obtained. It can also be known from the operation results in FIG. 4A and FIG. 4C that the length difference falls within the range of 0-10 mm between the $3^{rd}$ and the $21^{st}$ executions of the iterative operation, that the change in the sum of energy has reduced by the $19^{th}$ execution of the iterative operation, and that the result of the $19^{th}$ execution of the iterative operation is therefore the optimal, i.e., the result from which the final two-dimensional grid model can be obtained. In other words, both methods described above for obtaining the smallest sum of energy can produce the optimal result. Please note that the foregoing description is directed to the lateral by way of example only, and that the same operations apply to the medial and the insole. The final two-dimensional grid model is obtained by performing the determination operation on multiple corrected medials 61, multiple corrected laterals 62, and multiple corrected insoles 63 separately, and combining the optimal medial, lateral, and insole. In short, a two-dimensional corrected grid model 60 satisfying the aforesaid conditions is obtained by an inductive selection from the multiple two-dimensional corrected grid models 60 produced by the iterative operation.

Through the steps described above, a three-dimensional last model with a non-developable surface can be flattened with precision and thereby converted into a two-dimensional grid model with a relatively low degree of distortion. In other words, planar templates made according to this two-dimensional grid model can be rendered to match the original three-dimensional last model faithfully.

Figure 5:
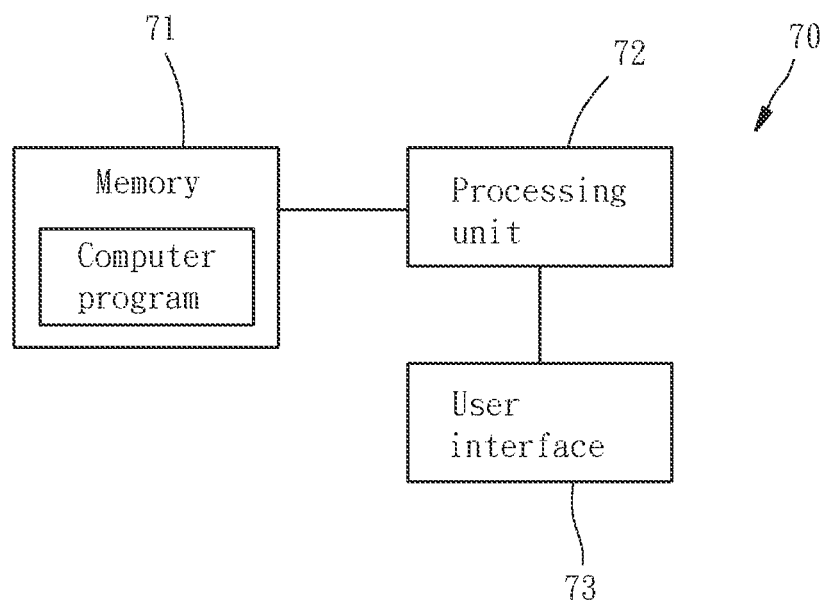
FIG. 5 is a block diagram of the system of the invention for flattening a three-dimensional shoe upper template.

Referring to FIG. 5, the present invention further provides a system 70 for flattening a three-dimensional shoe upper template. The system 70 includes a memory 71, a processing unit 72, and a user interface 73. The memory 71 is electrically connected to the processing unit 72. The processing unit 72 generates the user interface 73. The memory 71 may be a non-transitory computer-readable medium such as a read-only memory, a flash memory, a hard disk drive, an optical disc, a USB (universal serial bus) flash drive, a network database, or other media where data can be accessed. The memory 71 is configured to store one or more computer programs that include a plurality of instructions. The processing unit 72 may be a central processing unit or a microprocessor. The user interface 73 is an interface through which a user can instruct the processing unit 72 to execute the one or more computer programs stored in the memory 71. The user interface 73 may work with a keyboard, a computer mouse, a touchpad, the touchscreen of a mobile electronic device (e.g., mobile phone or tablet computer), or other similar devices (not shown); the invention has no limitation in this regard. When the one or more computer programs are executed by the processing unit 72, the aforesaid method for flattening a three-dimensional shoe upper template is carried out.

The processing unit 72 may be a single processor or include a plurality of processors. When the processing unit 72 includes a plurality of processors, those processors may be provided in the same equipment or in different pieces of equipment respectively. When the different pieces of equipment are stored in different places respectively, the method of the present invention for flattening a three-dimensional shoe upper template can be performed remotely or in a cloud-based manner. When at least one of the foregoing steps, sub-steps, or computer programs is executed by processors located in different pieces of equipment respectively, and the different pieces of equipment are stored in different places respectively, the method of the invention for flattening a three-dimensional shoe upper template can be performed by a plurality of users, and this multi-user operation process provided by the invention can be carried out at different times from different places. In other words, the method of the invention for flattening a three-dimensional shoe upper template is not necessarily performed at a single time point, in a single place, with a single piece of equipment, or by a single person. Rather, the method of the invention for flattening a three-dimensional shoe upper template can be used flexibly in various ways.

Furthermore, the method of the present invention for flattening a three-dimensional shoe upper template is not necessarily applied to shoemaking and may be applied to shipbuilding, tube making, cartography, medical diagnosis, apparel design, and so on.

The embodiments disclosed herein are not limiting but serve illustrative purposes only. Any equivalent modification or change that is made to the disclosed embodiments without departing from the spirit or concept of the present invention shall fall within the scope of the appended claims.

What is claimed is:

1. A method for flattening a three-dimensional shoe upper template, comprising the steps of:

providing a three-dimensional last model, wherein the three-dimensional last model comprises a three-dimensional borderline, and the three-dimensional borderline comprises a three-dimensional inner feather line and a three-dimensional outer feather line;

performing a topological operation on the three-dimensional last model by a processing unit to obtain a three-dimensional grid model corresponding to the three-dimensional last model, wherein the three-dimensional grid model comprises a plurality of three-dimensional border grids and a plurality of three-dimensional inner grids, and each said three-dimensional border grid has a portion located on the three-dimensional borderline;

performing a thickening operation on the three-dimensional grid model by the processing unit to obtain a three-dimensional thickened grid model;

performing a dimensionality reduction operation on the three-dimensional thickened grid model by the processing unit to obtain a two-dimensional initial-value grid model; and obtaining a two-dimensional grid model with a smallest energy value by the steps of:

performing an iterative operation for finding a least-squares solution on the two-dimensional initial-value grid model by the processing unit to obtain a two-dimensional corrected grid model from each execution of the iterative operation, wherein each said two-dimensional corrected grid model comprises a plurality of two-dimensional corrected border grids corresponding to the three-dimensional border grids and a plurality of two-dimensional corrected inner grids corresponding to the three-dimensional inner grids, the two-dimensional corrected border grids of each said two-dimensional corrected grid model jointly define a two-dimensional corrected borderline, each said two-dimensional corrected borderline comprises a two-dimensional corrected inner feather line and a two-dimensional corrected outer feather line, and there is a length difference between each said two-dimensional corrected inner feather line and the three-dimensional inner feather line or between each said two-dimensional corrected outer feather line and the three-dimensional outer feather line;

performing an energy operation on each said two-dimensional corrected grid model by the processing unit to calculate a sum of energy of the two-dimensional corrected border grids of each said two-dimensional corrected grid model; and obtaining a two-dimensional grid model with a said length difference from a plurality of said two-dimensional corrected grid models produced by the iterative operation falling within a predetermined range and with said two-dimensional corrected border grids having the smallest said sum of energy.

2. The method for flattening a three-dimensional shoe upper template as claimed in claim 1, wherein the thickening operation comprises: selecting a normal vector of each said three-dimensional border grid; and adding a predetermined thickness according to the selected normal vectors to form the three-dimensional thickened grid model.

3. The method for flattening a three-dimensional shoe upper template as claimed in claim 2, wherein the predetermined thickness is 0-1 mm.

4. The method for flattening a three-dimensional shoe upper template as claimed in claim 1, wherein the sum of energy corresponding to a said execution of the iterative operation is determined to be the smallest if a $\log_{10}$ of an absolute value of a difference between the sum of energy corresponding to the execution of the iterative operation and the sum of energy corresponding to a previous said execution of the iterative operation is less than $-1$.

5. The method for flattening a three-dimensional shoe upper template as claimed in claim 1, wherein the predetermined range for said length differences is 0-10 mm.

6. The method for flattening a three-dimensional shoe upper template as claimed in claim 1, wherein the iterative operation is executed 1-50 times.

7. A system for flattening a three-dimensional shoe upper template, comprising:
a memory for storing at least one computer program including a plurality of instructions;
a processing unit for executing the instructions:
provide a three-dimensional last model, wherein the three-dimensional last model comprises a three-dimensional borderline, and the three-dimensional borderline comprises a three-dimensional inner feather line and a three-dimensional outer feather line;
perform a topological operation on the three-dimensional last model to obtain a three-dimensional grid model corresponding to the three-dimensional last model, wherein the three-dimensional grid model comprises a plurality of three-dimensional border grids and a plurality of three-dimensional inner grids, and each said three-dimensional border grid has a portion located on the three-dimensional borderline;

perform a thickening operation on the three-dimensional grid model to obtain a three-dimensional thickened grid model;
perform a dimensionality reduction operation on the three-dimensional thickened grid model to obtain a two-dimensional initial-value grid model; and
obtain a two-dimensional grid model with a smallest energy value by:
performing an iterative operation for finding a least-squares solution on the two-dimensional initial-value grid model to obtain a two-dimensional corrected grid model from each execution of the iterative operation, wherein each said two-dimensional corrected grid model comprises a plurality of two-dimensional corrected border grids corresponding to the three-dimensional border grids and a plurality of two-dimensional corrected inner grids corresponding to the three-dimensional inner grids, the two-dimensional corrected border grids of each said two-dimensional corrected grid model jointly define a two-dimensional corrected borderline, each said two-dimensional corrected borderline comprises a two-dimensional corrected inner feather line and a two-dimensional corrected outer feather line, and there is a length difference between each said two-dimensional corrected inner feather line and the three-dimensional inner feather line or between each said two-dimensional corrected outer feather line and the three-dimensional outer feather line;

performing an energy operation on each said two-dimensional corrected grid model to calculate a sum of energy of the two-dimensional corrected border grids of each said two-dimensional corrected grid model; and obtaining a two-dimensional grid model with a said length difference from a plurality of said two-dimensional corrected grid models produced by the iterative operation falling within a predetermined range and with said two-dimensional corrected border grids having the smallest said sum of energy; and a user interface generated by the processing unit.

8. The system for flattening a three-dimensional shoe upper template as claimed in claim 7, wherein the thickening operation comprises: selecting a normal vector of each said three-dimensional border grid; and adding a predetermined thickness according to the selected normal vectors to form the three-dimensional thickened grid model.

9. The system for flattening a three-dimensional shoe upper template as claimed in claim 8, wherein the predetermined thickness is 0-1 mm.

10. The system for flattening a three-dimensional shoe upper template as claimed in claim 7, wherein the sum of energy corresponding to a said execution of the iterative operation is determined to be the smallest if a $\log_{10}$ of an absolute value of a difference between the sum of energy corresponding to the execution of the iterative operation and the sum of energy corresponding to a previous said execution of the iterative operation is less than $-1$.

11. The system for flattening a three-dimensional shoe upper template as claimed in claim 7, wherein the predetermined range for said length differences is 0-10 mm.

12. The system for flattening a three-dimensional shoe upper template as claimed in claim 7, wherein the iterative operation is executed 1-50 times.

13. A non-transitory computer-readable recording medium for storing at least one computer program including a plurality of instructions to be executed by a processing unit, wherein the instructions, when executed by the processing unit, cause the processing unit to:
- provide a three-dimensional last model, wherein the three-dimensional last model comprises a three-dimensional borderline, and the three-dimensional borderline comprises a three-dimensional inner feather line and a three-dimensional outer feather line;
- perform a topological operation on the three-dimensional last model to obtain a three-dimensional grid model corresponding to the three-dimensional last model, wherein the three-dimensional grid model comprises a plurality of three-dimensional border grids and a plurality of three-dimensional inner grids, and each said three-dimensional border grid has a portion located on the three-dimensional borderline;
- perform a thickening operation on the three-dimensional grid model to obtain a three-dimensional thickened grid model;
- perform a dimensionality reduction operation on the three-dimensional thickened grid model to obtain a two-dimensional initial-value grid model; and
- obtain a two-dimensional grid model with a smallest energy value by:
  - performing an iterative operation for finding a least-squares solution on the two-dimensional initial-value grid model to obtain a two-dimensional corrected grid model from each execution of the iterative operation, wherein each said two-dimensional corrected grid model comprises a plurality of two-dimensional corrected border grids corresponding to the three-dimensional border grids and a plurality of two-dimensional corrected inner grids corresponding to the three-dimensional inner grids, the two-dimensional corrected border grids of each said two-dimensional corrected grid model jointly define a two-dimensional corrected borderline, each said two-dimensional corrected borderline comprises a two-dimensional corrected inner feather line and a two-dimensional corrected outer feather line, and there is a length difference between each said two-dimensional corrected inner feather line and the three-dimensional inner feather line or between each said two-dimensional corrected outer feather line and the three-dimensional outer feather line;
  - performing an energy operation on each said two-dimensional corrected grid model to calculate a sum of energy of the two-dimensional corrected border grids of each said two-dimensional corrected grid model; and
  - obtaining, from a plurality of said two-dimensional corrected grid models produced by the iterative operation, a two-dimensional grid model with a said length difference falling within a predetermined range and with said two-dimensional corrected border grids having the smallest said sum of energy.

14. The non-transitory computer-readable medium as claimed in claim 13, wherein the thickening operation comprises: selecting a normal vector of each said three-dimensional border grid; and adding a predetermined thickness according to the selected normal vectors to form the three-dimensional thickened grid model.

15. The non-transitory computer-readable medium as claimed in claim 14, wherein the predetermined thickness is 0-1 mm.

16. The non-transitory computer-readable medium as claimed in claim 13, wherein the sum of energy corresponding to a said execution of the iterative operation is determined to be the smallest if a $\log_{10}$ of an absolute value of a difference between the sum of energy corresponding to the execution of the iterative operation and the sum of energy corresponding to a previous said execution of the iterative operation is less than −1.

17. The non-transitory-computer-readable medium as claimed in claim 13, wherein the predetermined range for said length differences is 0-10 mm.

18. The non-transitory-computer-readable medium as claimed in claim 13, wherein the iterative operation is executed 1-50 times.

* * * * *